United States Patent [19]
Bi et al.

[11] Patent Number: 5,997,993
[45] Date of Patent: Dec. 7, 1999

[54] PROTECTIVE OVERCOAT USEFUL FOR ENHANCING AN ARTICLE RESISTANCE TO AMBIENT HUMIDITY

[75] Inventors: Daoshen Bi, Burlington; John M. Hardin, Jamaica Plain, both of Mass.

[73] Assignee: Polaroid Corporation, Cambridge, Mass.

[21] Appl. No.: 08/975,279

[22] Filed: Nov. 20, 1997

Related U.S. Application Data

[60] Provisional application No. 60/031,336, Nov. 20, 1996.

[51] Int. Cl.[6] .......................................... B32B 3/00
[52] U.S. Cl. .......................... 428/195; 428/480; 428/913; 430/203; 430/523; 430/270.1; 430/273.1; 430/950
[58] Field of Search ..................... 430/203, 523, 430/270.1, 273.1, 950; 428/195, 480, 913

[56] References Cited

U.S. PATENT DOCUMENTS

| | | | |
|---|---|---|---|
| 2,173,480 | 9/1939 | Jung | 88/19.5 |
| 3,622,373 | 11/1971 | Page et al. | 117/76 |
| 3,696,746 | 10/1972 | Harper | 101/465 |
| 3,733,293 | 5/1973 | Gallagher et al. | 260/29.6 |
| 4,055,429 | 10/1977 | Holmes et al. | 96/74 |
| 4,203,769 | 5/1980 | Guestaux | 430/631 |
| 4,472,494 | 9/1984 | Hallman et al. | 430/160 |
| 4,767,557 | 8/1988 | Herdeman | 252/91 |
| 4,814,254 | 3/1989 | Naito et al. | 430/203 |
| 5,034,057 | 7/1991 | Smith | 106/18.17 |
| 5,200,299 | 4/1993 | Steppan et al. | 430/281 |
| 5,242,779 | 9/1993 | Mueller-Hess et al. | 430/175 |
| 5,599,650 | 2/1997 | Bi et al. | 430/273.1 |
| 5,677,108 | 10/1997 | Chia et al. | 430/273.1 |
| 5,811,220 | 9/1998 | Cheng et al. | 430/302 |

FOREIGN PATENT DOCUMENTS

| | | | |
|---|---|---|---|
| 0175244 | 3/1986 | European Pat. Off. | G03F 7/08 |
| 0573805 | 12/1993 | European Pat. Off. | G03F 7/029 |

OTHER PUBLICATIONS

PCT International Search Report for PCT/US97/21127 (Forms PCT/ISA/210 and 220), mailed Apr. 3, 1998.
Patent Abstracts of Japan, vol. 11, No. 183 (M–598), Jun. 12, 1987.

*Primary Examiner*—William Krynski
*Assistant Examiner*—B. Shewareged
*Attorney, Agent, or Firm*—Renato M. de Luna

[57] ABSTRACT

The present invention provides a lithographic printing plate precursor element capable of being used on a printing press immediately after imagewise exposure without the requirement of bath processing. A preferred embodiment has in order (a) a substrate; and (b) a photoresist photohardenable upon imagewise exposure to actinic radiation, the photoresist comprising (i) a macromolecular organic binder; (ii) a photopolymerizable ethylenically unsaturated monomer having at least one terminal ethylenic group capable of forming a high polymer by chain-propagated polymerization, and (iii) a polymerization initiator activatable by actinic radiation; and (c) an on-press removable polyphosphate-containing overcoat. The polyphosphate-containing overcoat imparts the plate with a non-tacky surface and an enhanced resistance to the adverse influence of ambient humidity.

6 Claims, 1 Drawing Sheet

PROTECTIVE OVERCOAT USEFUL FOR ENHANCING AN ARTICLE RESISTANCE TO AMBIENT HUMIDITY

REFERENCE TO RELATED APPLICATION

This application claims the benefit of Provisional U.S. patent application Ser. No. 60/031,336, filed Nov. 20, 1996.

FIELD OF THE INVENTION

The present invention relates generally to a lithographic printing plate precursor element that does not require "bath-processing" subsequent to its exposure and prior to its use on a press. More particularly, the present invention relates to a lithographic printing plate precursor element provided with an overcoat containing polyphosphates in amounts sufficient to impart an enhanced resistance to ambient humidity.

BACKGROUND

At the present time, virtually all printed copy is produced through the use of three basic types of printing plates. One type is a relief plate which prints from a raised surface. Another type is an intaglio plate which prints from a depressed surface. The third type is a lithographic plate which prints from a substantially flat surface which is neither appreciably raised above nor appreciably depressed below the adjacent and surrounding non-printing areas. The present invention concerns the third type of printing plate.

Lithographic printing is occasioned by an ink's respective affinity and/or aversion to areas of different chemical properties. Lithographic printing plates are commonly processed to have water-repellent (hydrophobic), oil-receptive (oleophilic) image areas and water-receptive (hydrophilic) non-image areas.

In preparing a conventional lithographic plate for use on a printing press, the plate is first imagewise exposed to actinic radiation to effect specific chemical reactions therein. Such photoinduced chemical reactions may either reduce or enhance the solubility of the photoresist, depending on whether the resist is negative-working or positive-working. In negative-working plates, exposure to actinic radiation will generally cause a "hardening" or insolubilization of the photoresist. In positive-working plates, exposure to actinic radiation will generally cause a "softening" or solubilization of the photoresist.

After photoexposure, a wet development step is normally conducted to remove those areas of the photoresist which have undergone photoinduced chemical change or those which have not been photoexposed. Solvation under conventional development techniques will typically involve treating the exposed plate with organic solvents in a developing bath. For negative-working resists, the solvent will swell and dissolve the unexposed portions of the resist. For positive-working resists, the response of the unexposed and exposed coatings are reversed, but the same general principles apply. In either case, the solvent should not react with the unintended portions, otherwise distortion of the developed image may result.

As a result of the preferential solvation and washing away of portions of the photoresist, corresponding portions of the underlying hydrophilic substrate are uncovered. For negative-working plates, the aforementioned hydrophobic image areas correspond to the portions of the photoresist remaining after salvation and washing, whereas the aforementioned hydrophilic non-image areas correspond to portions of the substrate revealed by said solvation and washing. The image and non-image areas thus differentiated, the processed plate may then be mounted onto a printing press and run.

Encumbered by required wet development, the processing of conventional lithographic plates prior to their use on a printing press is both time and labor consuming and involves use of volatile organic chemicals. Considerable desire is thus present for means that would satisfactorily eliminate or reduce the long-felt dependency of conventional lithographic processes upon the conduct of wet development and thereby permit use of lithographic plates on a printing press immediately after exposure without required post-exposure prepress processing.

So-called "expose-only", "no-process", and "on-press developable" lithographic plates have been suggested. Among printing plates that may be characterized as such are: e.g., U.S. Pat. No. 3,793,033, issued to Mukhedjee on Feb. 19, 1974; U.S. Pat. No. 4,273,851, issued to Muzyczko et al. on Jun. 16, 1981; U.S. Pat. No. 4,408,532, issued to J. H. Incremona on Oct. 11, 1983; U.S. Pat. No. 5,258,263, issued to Z. K. Cheema, A. C. Giudice, E. L. Langlais, and C. F. St. Jacques on Nov. 2, 1993; U.S. Pat. No. 5,368,973, issued to Hasegawa on Nov. 29, 1994; U.S. Pat. No. 5,395,734, issued to Vogel et al. on Mar. 7, 1995; U.S. Pat. No. 5,506,090, issued to Gardner et al. on Apr. 9, 1996; U.S. Pat. No. 5,514,522, issued to W. C. Schwarzel, F. R. Kearney, M. J. Fitzgerald, and R. C. Liang on May 7, 1996; and U.S. Pat. No. 5,516,620, issued to L. C. Wan, A. C Giudice, J. M. Hardin, C. M. Cheng, and R. C. Liang on May 14, 1996. Mention may also be made of PCT/US95/11104; U.S. Pat. No. 5,488,147; GB 9322705; EP 599463; EP 562952; U.S. Pat. No. 5,314,785; U.S. Pat. No. 5,225,316; U.S. Pat. No. 5,235,015; U.S. Pat. No. 5,102,771; and U.S. Pat. No. 5,085,972.

While good results are obtained from current on-press developable plates, a desire has developed to extend the performance of such and like media across a wider range of environmental conditions without departing from good imaging performance. Of particular interest is the realization of such performance under varying environmental conditions, particularly tropical (i.e., hot and humid) conditions, these conditions being foreseeably encountered when such media are transported, stored, and/or used during imaging and development. Advantage may be derived from reduced implementation of environmentally-insulating packaging, transportation, and storage, as well as by ameliorating the affects on imaging of environmental conditions.

SUMMARY OF THE INVENTION

It has been found that provision of a polyphosphate-containing overcoat overlying the photosensitive layer of a lithographic plate (conventional or otherwise) results in a printing article that is both durable and non-tacky, and which—of particular note—has an enhanced resistance to the influence of adverse ambient humidity.

In the accomplishment of its objectives, the present invention provides a printing plate precursor element comprising: (a) a substrate having either an affinity or aversion to printing ink; (b) a photosensitive layer deposited over said substrate having either an affinity or aversion to said ink solution substantially opposite said affinity or aversion of said substrate, said photosensitive layer including at least a photopolymerizable, photocrosslinkable, or photorearrangeable compound and whereby said photosensitive layer is capable of being imagewise photohardened, photosolubilized, or photodifferentiated upon imagewise exposure to actinic radiation; and (c) a polyphosphate-containing overcoat deposited over said photosensitive layer.

While the inventive features of the present invention can be used to advantage in combination with conventional lithographic plate structures, it is a particular object of the present invention to provide a lithographic plate capable of being used on a printing press immediately after imagewise exposure without the requirement of intermediate bath processing.

It is another object of the present invention to provide a non-tacky on-press developable lithographic plate having good durability and enhanced resistance to the adverse influence of ambient humidity.

It is another object of the present invention to provide an on-press developable overcoated lithographic plate having in order (a) a substrate, (b) a photosensitive layer, and (c) a polyphosphate-containing overcoat.

It is another object of the present invention to provide a method for developing and printing images "on-press", said method involving the use of a printing plate precursor element characterized by the provision thereon of an on-press removable polyphosphate-containing overcoat.

For a fuller understanding of the nature and objects of the invention, reference should be had to the following description taken in conjunction with the accompanying drawings.

DETAILED DESCRIPTION

Figure 1:
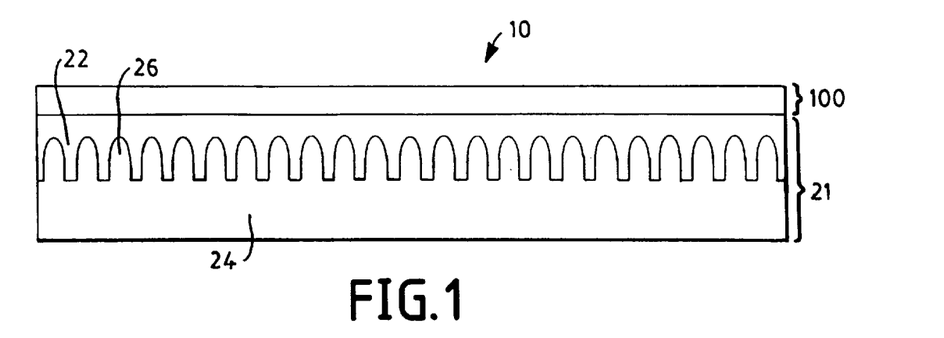
FIG. 1 is a schematic representation of an overcoated lithographic plate 10 according to a preferred product embodiment of the present invention, the plate being shown prior to imagewise exposure to actinic radiation.

With reference to FIG. 1, the present invention—in accordance with its product aspects—sets forth a multilayer printing plate precursor element 10 comprising in general a substrate 24, a photosensitive layer 22, and a non-tacky polyphosphate-containing overcoat 100.

More particularly, in the inventive product combination 10, the substrate 24 has or is processed to have either an affinity or aversion to printing fluid (e.g., lithographic ink), whereas the photosensitive layer 22 deposited over said substrate 24 is formulated having either an affinity or aversion to said press fluid substantially opposite said affinity or aversion of said substrate. Imagewise removal of portions of the photosensitive layer 22 results in the correspondent baring of the underlying substrate 24, and consequently sets forth the surface differentiation important for the accomplishment of a lithographic printing operation. Details of the composition and preparation of substrate 24 and photosensitive layer 22 are provided further below.

To protect the plate 21 from physical and environmental damage which may occur before its intended use, a non-tacky, light-transmissive, polyphosphate-containing overcoat is deposited over said photosensitive layer. The protective overcoating 100—the component of primary importance to the inventive product—protects the photosensitive layer 22 from the detrimental physical effects of handling and manipulation and—by the inclusion therein of sufficient concentrations of suitable polyphosphates—enhances the resistance of the plate to the adverse influence of elevated ambient humidity.

In general, polyphosphates favored for the present invention are those made from orthophosphates. In this regard, it will be appreciated that heating orthophosphates to high temperatures results in the removal of water molecules. The resultant chemical rearrangement effects formation of a variety of linear and cyclic polyphosphates, some of which are glassy and of relatively high molecular weight, others taking the form of crystalline phosphate complexes.

Such water-depleted polyphosphate species are useful because they are capable of undergoing hydrolysis at various rates (i.e., depending upon pH, temperature, amount of water, etc.) to reform orthophosphates. While the present inventors do not wish to be limited to any theory in explanation of their invention, it is believed that this hydrolytic sensitivity provides an important basis for the overcoat's enhanced resistance to humidity. Essentially, the rehydration of the polyphosphate "ties up" atmospheric water preventing or curtailing humidity-induced degradation. This molecular reincorporation of water into the polyphosphate compound is markedly different in function and in result from absorption or adsorption of water by hygrosopic materials (e.g., gum arabic, silica, and like dessicants), which—by drawing water into the overcoat—only exacerbates the effects of humidity.

Accordingly, although sodium polyphosphate is presently preferred (particularly, in view of its ready availability), other complex polymeric or "glassy" phosphates (e.g., trimetaphosphate, hexametaphosphate, tripolyphosphate, pyrophosphate, hypophosphate, and the like) soluble in and/or otherwise compatible with the overcoat formulation can be incorporated to accomplish an equivalent function. These complex phosphates can be incorporated in the form of a sodium salt, a lithium salt, a potassium salt, an ammonium salt, and the like, or combinations thereof. It is contemplated that other compounds capable of undergoing hydrolysis and soluble in the overcoat formulation could provide substantially similar functionality.

Although the reincorporation of water molecules by the polyphosphate component is believed important, it is also believed that in the deposition of overcoat 100 onto photosensitive layer 22 during manufacture of lithographic plate 10, the polyphosphate functions as a good emulsifier. The resultant layer is more uniform and is characterized by its infrequency of surface imperfections (e.g., pores, cracks, and fissures) believed to contribute to a conventional overcoat's vulnerability to ambient humidity.

Aside from its polyphosphate component, the polymeric protective overcoat 100 also comprises at the least a bath-removable or press-removable hydrophilic film-forming polymer, such as polyvinyl alcohol, gum arabic, polymethacrylic acid, polyacrylic acid, polyvinyl sulfonic acid, and polydiallyldimethyl ammonium chloride. In the use of polymers containing acid functionality (e.g., carboxylic acid and sulfonic acids), the acid functionality thereof may be wholly or partially converted to a salt (e.g., sodium, potassium, ammonium, etc.). Examples of such polymers include polymethacrylic acid sodium salt, polymethacrylic ammonium salt, and polyvinyl sulfonic acid sodium salt.

While the overcoat 100 is preferably configured as a fountain soluble or dispersible polymeric layer, other configurations are contemplated.

For example, an overcoat 100 can be made from a solvent-coated oleophilic polymer. Such organic overcoat could be designed to be readily soluble in printing ink, in which case, removed remnants of the overcoat will be "taken up" by the press ink, thus reducing pollution of the fountain solution.

Alternatively, the overcoat 100 can be configured as an emulsion, for example, oleophilic polyurethane particles dispersed in a hydrophilic polyvinyl alcohol matrix. Here, removability is occasioned by permeation of fountain solution through the emulsion overcoat, solubilizing unexposed areas of the underlying photoresist, and thereby "undercutting" the overlying overcoat. Depending on its particular configuration, an emulsion-type overcoat may manifest marked hydrophobicity (as opposed to the hydrophilicity of the aforediscussed preferred overcoats). Accordingly, the effect on the printed image of residual overcoat material remaining on exposed photohardened image areas would be relatively inconsequential to its operability.

Where a so-called on-press developable, expose-only, or no-process plate is desired, further advantage is obtained by formulating the overcoat 100 to be readily "on-press removable". On-press removability can be advanced by the incorporation into the overcoat of a fountain soluble or dispersible crystalline compound, which when treated on press effects a reduction in the overcoat's structural integrity. Examples of suitable crystalline compounds include sucrose, glucose, lactose, saccharides, polysaccharides, and their derivatives, which can be incorporated into overcoat 100 in concentrations (by % dry solid weight) of from approximately 2 to 6%. Further reference for additional technical details in this regard can be made to the International Patent Application No. PCT/US96/05467 (Publication No. WO 96/34317) (Chia et al.).

It will be appreciated that the use of a hydrophilic overcoat on certain negative-working plate configurations can result in a loss of resolution and ink receptability, which can be attributed to post-exposure surface interactions between the overcoat 100 and the underlying photosensitive layer 22. The loss is especially pronounced in those systems where removal of a protective overcoat is effected by the comparatively mild washing and/or rinsing extant in a typical lithographic printing operation. To control said loss, suitable compounds (e.g., a "polymeric quencher") can be incorporated into the overcoat 100 to deactivate (or otherwise regulate) photoreactions at the surface of the photosensitive layer 22 without interfering with desired photoreactions in remaining areas. A suitable polymeric quencher can be made, for example, by reacting 4-amino TEMPO, i.e., 4-amino-2,2,6,6-tetramethyl-1-piperidinyloxy, and 2-aminoethyl sulfonic acid with ethylmethacrylate to give TEMPO and sulfonate-substituted copolymers.) Further reference for additional technical details in this regard can be made to U.S. Pat. No. 5,599,650, issued to Bi et al. on Feb. 4, 1997.

Other ingredients, such as a surfactant and a second water-soluble polymer, may provide additional advantages when incorporated into the overcoat 100. Examples of suitable "second" polymers include but are not limited to polyvinyl alcohol, polyvinyl alcohol copolymers, acrylic ester polymers and copolymers, hydroalkyl cellulose and its derivatives, gum arabic, and gelatin. A low to medium molecular weight, partially hydrolyzed polyvinyl alcohol is preferred. Regarding surfactants, nonionic varieties having an HLB value between 10 and 14 are desirable.

In addition to its novel product aspects, the present invention also provides a closely-related method for lithographically printing images on a receiving medium (e.g., paper) from a printing plate immediately after the imagewise exposure thereof, without the requirement of intermediate bath processing or like off-press development steps. In the accomplishment of the objective, the method calls for the utilization of an on-press developable printing plate precursor element provided with an on-press removable polyphosphate-containing overcoat.

Practice of the inventive methodology commences initially with the provision of a photosensitive composition comprising at least a photopolymerizable, photocrosslinkable, or photorearrangeable compound. Typically and preferably, the ingredients of the photosensitive composition are formulated in an organic solvent, such as methyl ethyl ketone. As a solvent-based resist, when developed on-press, remnants of the removed resist will be "taken up" by the press ink solution. Accordingly, contamination of the press fountain solution (and the concomitant degradation of print quality) is avoided. Details in respect of the photopolymerizable, photocrosslinkable, or photorearrangeable compound are provided further below.

After preparation of the photosensitive composition, the composition is then deposited onto a suitable substrate 24 to provide a photosensitive layer 22 thereon. If properly prepared, the photosensitive layer 22 should be capable of being photohardened, photoinsolubilized, or photodifferentiated upon imagewise exposure to actinic radiation.

To protect the plate from adverse physical and environmental conditions, a polymeric polyphosphate-containing overcoat (as discussed above) is subsequently deposited over said photosensitive layer, said polymeric overcoat being soluble or dispersible in said fountain and ink solutions such that said polymeric overcoat can be removed by said fountain and ink solutions.

Figure 2:
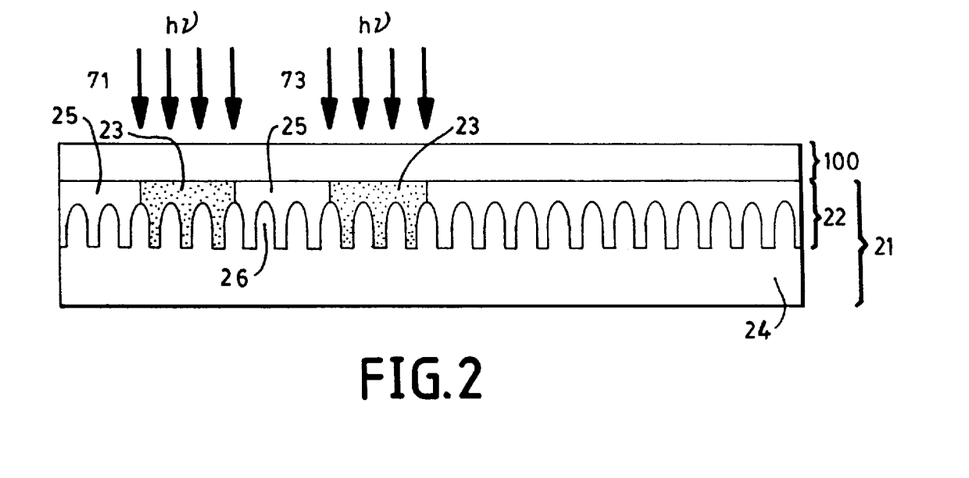
FIG. 2 schematically illustrates the overcoated lithographic plate 10 of FIG. 1 during imagewise exposure of photoresist layer 22 to actinic radiation, hv, the exposure being conducted through an on-press removable polymeric overcoat 100.

Finally, the photosensitive layer 22 is imagewise exposed to actinic radiation, imagewise exposure being conducted through the overcoat 100. See FIG. 2. Depending on its formulation, the actinic radiation causes exposed areas of the photoresist layer to imagewise "harden", "solubilize" (i.e., "soften"), or otherwise differentiate, as an immediate or indirect result of the photopolymerization, photocrosslinking, or photorearrangements of its constituent components. Actinic radiation exposure thus produces an imagewise differentiation in said photosensitive layer.

Figure 3:
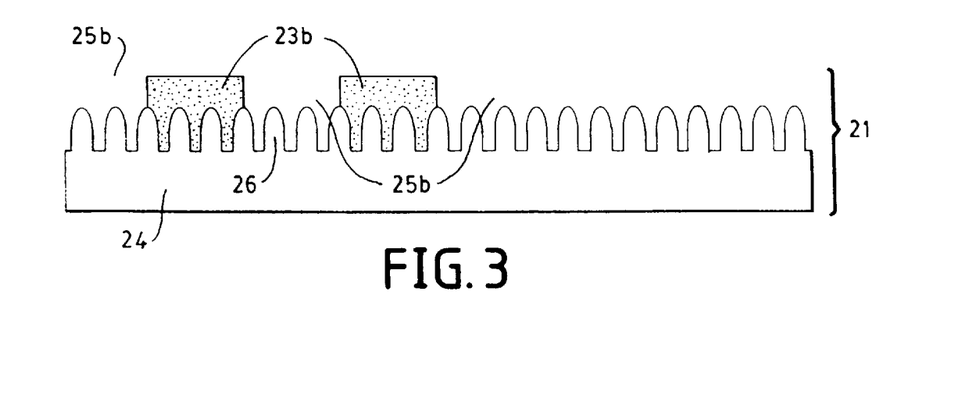
FIG. 3 illustrates the lithographic plate of FIG. 1 after development, and subsequent to the exposure shown in FIG. 2, whereby polymeric overcoat 100 and unexposed regions 25 of photoresist layer 22 have been removed. In accord with method aspects the present invention, development is occasioned "on-press".

The exposed lithographic plate is then mounted directly onto a lithographic printing press for the conduct of a printing operation. Printing is occasioned without requirement of an intermediate wet bath development step or other like prepress processing. Instead, during the printing run, the imagewise differentiated photosensitive layer 22 contacts and is submitted to the influence of lithographic fountain and ink solution. Applied over the surface of the photosensitive layer 22—removing the on-press removable overcoat 100— the fountain solution in time penetrates the photosensitive layer 22, and thereby effects a washing or rinsing of said layer. As shown in FIG. 3, in negative-working plates, the fountain and ink solutions typically effect removal of unexposed areas 25 of the photoresist layer 22, thus correspondingly baring the underlying substrate 24. Ink collects ultimately on either exposed or unexposed areas of the photosensitive layer 22 (depending on whether said layer is positive-working or negative-working) and is then transferred to a receiving medium, such as paper.

In a particular mode of practice, the printing plate 10 is mounted on the plate cylinder of an offset lithographic press which, as it rotates, comes into contact successively with rollers wet by a fountain solution and rollers wet by ink. The fountain and ink solution (sprayed or otherwise deposited onto dampening rollers and inking rollers, respectively) contacts the plate, leading to the aforediscussed interaction of the fountain and ink solutions with the photosensitive layer. The fountain solution contacts the non-printing areas of the plate and prevents ink from contacting these areas. The ink likewise contacts the image areas and is subsequently transferred to an intermediate blanket cylinder. The ink image is then transferred to the receiving medium (e.g., paper) as it passes between the intermediate blanket cylinder and an impression cylinder.

In preferred embodiments of the present invention, the photosensitive layer 22 is designed as a photohardenable photoresist comprising at least a binder, a polymerizable monomer, and an initiator.

The polymerizable monomer may include any variety of compounds, mixtures, or mixtures of reaction compounds or materials capable of being physically altered by photoexposure or of promoting physical alteration (e.g., hardening) of the properties of the layer in areas of photoexposure. Compounds and materials suitable for this purpose include monomeric photopolymerizable compounds which undergo free-radical or cation-initiated polymerization. A large number of useful compounds is available, generally characterized by a plurality of terminal ethylenic groups.

Especially preferred for promoting photohardening of polymeric resist layer is a polymerizable monomer which forms a macromolecular or polymeric material upon photoexposure, preferably a photopolymerizable ethylenically unsaturated monomer having at least one terminal ethylenic group capable of forming a high polymer by free-radical initiated, chain-propagated polymerization. Examples of such unsaturated compounds include acrylates, acrylamides, methacrylates, methacrylamides, alkyd compounds, vinyl ethers, vinyl esters, N-vinyl compounds, styrene, crotonates and the like. Polymerization can be effected by using a photoinitiator, such as a free-radical generating, addition polymerization-initiating system activatable by actinic radiation. Such initiating systems are known and examples thereof are described below.

Preferred polymerizable monomers are the polyfunctional acrylate monomers such as the acrylate and methacrylate esters of ethylene glycol, trimethylolpropane and pentaerythritol. These can be polymerized in exposed regions of a polymeric photoresist in the presence of a photoinitiator. Suitable photoinitiators include the derivatives of acetophenone (such as 2,2-dimethoxy-2-phenylacetophenone), benzophenone, benzil, ketocoumarin (such as 3-benzoyl-7-methoxy coumarin), xanthone, thioxanthone, benzoin or an alkyl-substituted anthraquinone, diaryl iodonium salt, triaryl sulfonium salts, azobisisobutyronitrile and azo-bis-4-cyanopentanoic acid, although others can be employed.

The practical concentration of the monomer or monomers employed is about 7.5%–70% by weight based on the total solids of the composition, and preferably between 15–40%.

Another principal component of the polymeric photoresist for most plates is a solvent-soluble hydrophobic binder of suitable oleophilicity and ink receptivity. Suitable binder materials include: vinylidene chloride copolymers (e.g., vinylidene chloride/acrylonitrile copolymers, vinylidene chloride/methylmethacrylate copolymers and vinylidene chloride/vinyl acetate copolymers); ethylene/vinyl acetate copolymers; cellulose esters and ethers (e.g., cellulose acetate butyrate, cellulose acetate propionate, and methyl, ethyl benzyl cellulose); synthetic rubbers (e.g., butadiene/acrylonitrile copolymers; chlorinated isoprene and 2-chloro-1,3-butadiene polymers); polyvinylesters (e.g., vinyl acetate/acrylate copolymers, poly(vinyl acetate) and vinyl acetate/methylmethacrylate copolymers); acrylate and methacrylate copolymers (e.g., polymethylmethacrylate); vinyl chloride copolymers (e.g., vinyl chloride/vinylacetate copolymers); and diazo resins such as the formaldehyde polymers and copolymers of p-diazo-diphenylamine.

The photoresist composition can be suitably coated or otherwise deposited into a layer which, upon photoexposure, undergoes hardening as the result of polymerization of the polymerizable monomer and grafting of the monomer onto the polymeric binder. If desired, other crosslinking agents, such as bis-azides and polythiols, can be included to promote crosslinking of the polymerizable monomers or the binders.

If desired, preformed polymers having pendant pyridium ylide groups, which groups, upon photoexposure, undergo ring expansion (photorearrangement) to a diazepine group with accompanying insolubilization can also be blended with the photoreactive polymer of this invention. Examples of polymers having such pyridium ylide groups are set forth in U.S. Pat. No. 4,670,528, issued to L. D. Taylor and M. K. Haubs on Jun. 2, 1987.

For other photosensitive compositions, rearrangement need not be intramolecular. Intermolecular rearrangement (essentially, photoinduced compound modification) is also contemplated. For example, a compound comprising a polymer with pendant acid labile group and a photoacid generator will undergo a rearrangement of sorts upon exposure to actinic radiation. Particularly, upon exposure, acids are generated that cleave the labile groups from said polymer, modifying the overall properties of said compound. Examples of such system can be found in U.S. Pat. Nos. 5,395,734, 5,225,316, and 5,102,771.

To prepare a lithographic plate for use in the present invention, the photosensitive composition is coated or otherwise deposited as a layer onto a substrate 24. Certain factors are considered in determining the appropriate materials for the substrate 24. Such factors vary with the particular lithographic needs of individual projects and are believed to be within the grasp of one skilled in the pertinent art. Regardless, for most lithographic needs envisioned, suitable substrates will generally include those to which the photosensitive layer 22 can be adhered adequately, prior to photoexposure, and to which photoexposed printing (image) areas are adhered after photoexposure. Other pertinent considerations may be extrapolated on the basis of the present disclosure.

In practice, substrate materials for use in the manufacture of printing plates will oftentimes be subjected to one or more treatments in order to improve adhesion of the photosensitive layer, or to increase the hydrophilic properties of the substrate material, and/or to improve the developability of the photosensitive coating, as is described in the U.S. Pat. No. 4,492,616 (issued Jan. 8, 1985 to E. Pliefke, et al.). Thus, the substrate 24 can be treated (for example, by polyvinylphosphonic acid or silicate or by anodization, or by corona discharge or plasma treatment, or by roughening or graining treatment) to promote desired adhesion of any photosensitive layers.

Especially preferred substrates are the metallic substrates of aluminum, zinc, or steel. Other preferred substrates are silicone rubbers and metallized plastic sheets such as those based on poly(ethylene terephthalate).

Preferred aluminum substrates are the grained, anodized aluminum plates, where the surface of the plate is roughened mechanically or chemically (e.g., electrochemically) by a combination of roughening treatments. Anodized plates can be used to provide an oxide surface. Other desirable plates are anodized aluminum plates which, for example, have been treated with polyvinylphosphonic acid or otherwise provided with a resinous or polymeric hydrophilic layer.

Examples of printing plate substrate materials which can be used in the production of printing plates of the invention, and methods of graining and hydrophilizing such substrates are described, for example, in U.S. Pat. No. 4,153,461 (issued May 8, 1979 to G. Berghäuser, et al.); the aforementioned U.S. Pat. No. 4,492,616 issued to E. Pliefke, et al.; U.S. Pat. No. 4,618,405 (issued Oct. 21, 1986 to D. Mohr, et al.); U.S. Pat. No. 4,619,742 (issued Oct. 28, 1986 to E. Pliefke); and U.S. Pat. No. 4,661,219 (issued Apr. 28, 1987 to E. Pliefke).

It is common practice in preparing photosensitive compositions to employ photosensitizers, coinitiators, and activators. Photosensitizers and coinitiators are relied upon to capture photons of exposing radiation. They may absorb light of different wavelengths from the principal photoinitiator. The activator in contrast is not relied upon to respond directly to exposing radiation, but rather adjacent activator and photosensitizer molecules react, following excitation of the latter by photon capture, causing release of a free radical which in turn induces immobilization addition reactions at sites of ethylenic unsaturation.

Photoexposure of the printing plate can be accomplished according to the requirements dictated by the particular composition of the photosensitive layer 22 and the thickness thereof. In general, actinic irradiation from conventional sources can be used for photoexposure, for example, relatively long wavelength ultraviolet irradiation or visible irradiation. UV sources will be especially preferred and include carbon arc lamps, "D" bulbs, xenon lamps and high pressure mercury lamps.

The thickness of the photosensitive layer 22 can vary with the particular requirements. In general, it should be of sufficient thickness to provide a durable photohardened printing surface. Thickness should be controlled, however, such that it can be exposed within exposure-time requirements and should not be applied at a thickness that hampers ready removal of the layer in exposed (or non-exposed) areas by developers. When utilizing an anodized, grained aluminum substrate, good results are obtained by using a polymeric photoresist having coverage of about 80 mg/ft$^2$ to 120 mg/ft$^2$ depending on the microstructure 26 of the grained substrate.

The photosensitive layer 22 can be provided with colorants, e.g., tint dyes, to provide a desired and predetermined visual appearance. Especially preferred will be a colorant, or a precursor of a species, respectively, capable either of being rendered colorless, or being provided with coloration by the irradiation of the plate-making photoexposure step. Such dye or dye-precursor compounds and the light absorption differences promoted by the photoexposure allow the platemaker to distinguish readily the exposed from the non-exposed regions of the plate in advance of mounting and running the photoexposed plate on a printing press.

The operability of the photosensitive layer 22 may be improved by the addition of certain additives. For example, the photosensitive layer 22 can contain plasticizers, additional hardeners, or other agents to improve coatability. The photosensitive layer 22 may also contain antioxidant materials to prevent undesired (premature) polymerization and examples include derivatives of hydroquinone; methoxy hydroquinone; 2,6-di-(t-butyl)-4-methylphenol; 2,2'-methylene-bis-(4-methyl-6-t-butylphenol); tetrakis {methylene-3-(3',5'-di-t-butyl-4'-hydroxyphenyl) propionate} methane; diesters of thiodipropionic acid, triarylphosphite. While the use of such additives is unnecessary for the operability of the present invention, incorporation of such additives may dramatically enhance performance.

While on-press developable plate embodiments of the present invention are suitable for many printing applications, they can be improved in respect of on-press developability by suitably modifying the photoresist composition or treating the photoresist layer for improved removability on the press. For example, good results may be accomplished by combining the teachings herein with those set forth in U.S. Pat. No. 5,516,620 and commonly assigned U.S. Pat. Nos. 5,561,029; 5,599,650; and 5,677,108. The photoresist layer 22 may also incorporate a plasticizing system and a photoreactive polymeric binder, as described in U.S. Pat. Nos. 5,607,816 and 5,514,522, respectively. Combinations with these on-press development systems and those described in the other patent applications cross-referenced herein are the suggested modes of utilization.

The present invention will now be described in further detail by the following non-limiting examples of several of its embodiments. In the Examples, the term "clean" is used to characterize the degree to which non-exposed areas (or background), $G_{min}$, are removed after on-press development; a "clean" image is one where ink is substantially absent from exposed background areas. The term "dark" or "black" (a difference of degree) means that non-imaged areas remain unremoved, ink collecting throughout the entire surface of the plate regardless of whether the area is exposed or not. A "dark" or "black" image indicates that the plate failed to develop. The term "plugging" indicates that, although the background is "clean", certain shadow dots (i.e., holes and space between dots) are "unopened" in the half tone areas at a frequency of around 50% (20–70%). The term "tone" indicates loss of hydrophilicity in non-exposed areas after plate development (i.e., non-exposed areas completely removed). Ink collects slightly on non-exposed areas and the prints reveal a grayish background.

EXAMPLES

Preparation of On-press Developable Lithographic Plate

In the preparation of lithographic plates, for Examples 1 to 7, below, a hydrophobic photoresist was deposited, at a coverage of from 80 to 110 mg/ft$^2$, onto an 8 mil (0.2 mm) hydrophilic aluminum substrate that had been electrochemically grained, anodized and treated with polyvinylphosphonic acid. The photoresist (coated @ 6.00% solids) is formulated as shown in the following Table A.

TABLE A

Preparation of Photoresist Formulation (Batch Size: 850 g)

| Component | Stock % | Wt % (Dry Film) | Grams |
|---|---|---|---|
| Acryloid Resin A-11 (from Rohm and Haas) | 20 | 12 | 30.60 |
| Photoreactive Acrylic Binder$^\alpha$ | 20 | 18.5 | 47.18 |
| Ebecryl 8301 Oligomer (from Radcure) | 20 | 7.3 | 18.62 |
| Dipentaerythritol pentacrylate, Sartomer SR399 | 50 | 50 | 51.00 |
| Pluronic L43 Surfactant (from BASF) | 20 | 4.8 | 12.24 |
| 3-benzoyl-7-methoxy coumarin | 2 | 1.4 | 35.70 |
| s-triazene$^\beta$ | 5 | 2.5 | 25.50 |
| Methyl Ethyl Ketone (MEK) | — | — | 445.87 |
| n-Butanol | — | — | 127.22 |
| BisOMLEV/BHT/1035 in n-Butanol | 3.183 | 2.1 | 33.65 |
| Bis OMLEV$^x$ | 3 | — | 0.00 |
| 2,6-di-tert-butyl-4-methyl phenol (BHT) | 0.136 | — | 0.00 |
| Irganox 1035 (antioxidant from Ciba-Geigy) | 0.048 | — | 0.00 |
| LCV/BHT/1035 (2X) in MEK | 3.183 | 1.4 | 22.43 |
| Leuco crystal violet | 3 | — | 0.00 |
| Irganox 1035 (antioxidant from Ciba-Geigy) | 0.048 | — | 0.00 |
| 2,6-di-tert-butyl-4-methyl phenol (BHT) | 0.135 | — | 0.00 |
| TOTAL | | 100.00 | 850.00 |

Notes:
$^\alpha$: The photoreactive acrylic binder contains methyl methacrylate, butyl methacrylate, maleic anhydride, and TMI adduct with hydroxybutyl acrylate. See, U.S. Pat. No. 5,556,924 and U.S. Pat. No. 5,514,522;
$^\beta$: 2-[p-(n-heptylaminocarbonyl)phenyl]-4,6-bis(trichloromethyl)-1,3,5-triazine; and
$^x$: bis-(4-diethylamino-o-tolyl)-4-diethylamino phenylmethane.

As discussed in more particular detail below, the plates were overcoated with an approximately 0.25 μm thick (i.e., 0.18 to 0.28 μm) polyphosphate-containing protective overcoat, thus producing a printing plate precursor element according to the present invention.

Examples 1 to 4

Overcoated printing plate precursor elements (i.e., Examples 1 to 4) were made in accordance with the Preparation above, and wherein the overcoat formulations were prepared using the recipes set forth in the following Table 1-A.

TABLE 1-A

Preparation of Overcoat Formulations
(Quantities Reported in % Weight Film Solids)

| Component | Ctrl-A 0% SPP | Ex. 1 2% SPP | Ex. 2 5% SPP | Ex. 3 7.5% SPP | Ex. 4 10% SPP |
|---|---|---|---|---|---|
| Polyvinyl Alcohol (PVA 603, from Air Products). | 64 | 64 | 64 | 64 | 64 |
| EMA-ASA-TEMPO (A sodium salt of 2-aminoethyl sulfonate and 4-amino TEMPO substituted poly(ethylene-maleic anhydride). See U.S. Pat. No. 5,599,650. | 22 | 22 | 22 | 22 | 22 |
| Sucrose. | 4.5 | 3.86 | 2.89 | 2.09 | 1.29 |
| Pluronic L43 Surfactant (A nonionic surfactant from BASF comprising block copolymers of propylene oxide and ethylene oxide, HLB 12.0). | 5 | 4.3 | 3.2 | 2.3 | 1.4 |
| Triton X-100 (an alkylphenol-ethylene oxide adduct). | 1.5 | 1.29 | 0.96 | 0.7 | 0.43 |
| Aerosol-OT (a dialkylester of sodium sulfosuccinic acid, from Fischer). | 5 | 2.6 | 1.9 | 1.4 | 0.9 |
| SPP (Sodium Polyphosphate). | 0 | 2 | 5 | 7.5 | 10 |

As apparent, the overcoat formulations of Examples 1 to 4 are for the most part similar but for the concentration of the polyphosphate component. The overcoat formulation of Ctrl-A ("Control") was formulated without polyphosphate. The plates were cut in half and stored for a day, half at room temperature, the other half under hot and/or humid conditions. The plates were then exposed, mounted onto a printing press, and run. Observations are provided in the following Tables 1-B-Ctrl, 1-B-1, 1-B-2, 1-B-3, and 1-B-4:

TABLE 1-B

Ctrl: Resolution of Control-A (0% SPP) Under
Different Storage Conditions, pH's, and Exposures

| Plate, pH, LU (Storage Condition) | Observation at Start of Run | | | Observations After 100 Images | | |
|---|---|---|---|---|---|---|
| | Steps | Hi/Sh | Hi$\mu$/Sh$\mu$ | Steps | Hi/Sh | Hi$\mu$/Sh$\mu$ |
| Control-A, pH ~ 9, LU = 4 (RT) | 9/14 | Plugging | Plugging | 7/10 | 2/80 | 6/40 |
| Control-A, pH ~ 9, LU = 8 (RT) | 11/— | 2/— | Plugging | 9/13 | 2/80 | 6/40 |
| Control-A, pH ~ 9, LU = 8 (40° C./80 RH/1D) | Black | — | — | Black | — | — |

Notes:
LU: Exposure light unit;
RH: Relative Humidity;
D: Days;
Hi: % Highlight dot;
Sh; % Shadow dot;
Hi$\mu$: Highlight microline;
Sh$\mu$: Shadow microline;
—: Data Not Collected.

TABLE 1-B-1

Resolution of Example 1 (2% SPP) Under Different Storage Conditions, pH's, and Exposures

| Plate, pH, LU | Observation at Start of Run | | | Observations After 100 Images | | |
|---|---|---|---|---|---|---|
| (Storage Condition) | Steps | Hi/Sh | Hi$\mu$/Sh$\mu$ | Steps | Hi/Sh | Hi$\mu$/Sh$\mu$ |
| Example 1, pH ~ 9, LU = 4 (RT) | 8/12 | 3/40 | 8/40 | 6/10 | 2/90 | 6/30 |
| Example 1, pH ~ 9, LU = 8 (RT) | 10/15 | 1/40 | 6/40 | 9/13 | 2/80 | 6/30 |
| Example 1, pH ~ 9, LU = 8 (40° C./80 RH/1D) | Black | — | — | 5% Clean | — | — |

Notes:
LU: Exposure light unit;
RH: Relative Humidity;
D: Days;
Hi: % Highlight dot;
Sh; % Shadow dot;
Hi$\mu$: Highlight microline;
Sh$\mu$: Shadow microline;
—: Data Not Collected.

TABLE 1-B-2

Resolution of Example 2 (5% SPP) Under Different Storage Conditions, pH's, and Exposures

| Plate, pH, LU | Observation at Start of Run | | | Observations After 100 Images | | |
|---|---|---|---|---|---|---|
| (Storage Condition) | Steps | Hi/Sh | Hi$\mu$/Sh$\mu$ | Steps | Hi/Sh | Hi$\mu$/Sh$\mu$ |
| Example 2, pH ~ 6.5, LU = 4 (RT) | 6/9 | 2/80 | 6/30 | 5/8 | 2/90 | 6/30 |
| Example 2, pH ~ 6.5, LU = 8 (RT) | 9/12 | 1/80 | 6/40 | 8/12 | 2/80 | 6/30 |
| Example 2, pH ~ 6.5, LU = 8 (40° C./80 RH/1D) | 11/— | 90% Clean | — | 8/12 | 2/80 | 6/30 |
| Example 2, pH ~ 6.5, LU = 8 (40° C./80 RH/1D) | 11/5 | 2/60 | 6/40 | 9/14 | 2/70 | 6/30 |
| Example 2, pH ~ 6.5, LU = 8 (60° C./2D) | 10/— | 90% Clean | — | 9/13 | 2/70 | 6/30 |
| Example 2, pH ~ 9, LU = 4 (RT) | 7/10 | 3/80 | 10/40 | 5/8 | 3/80 | 6/40 |
| Example 2, pH ~ 9, LU = 8 (RT) | 9/13 | 2/70 | 6/40 | 8/12 | 2/80 | 6/40 |
| Example 2, pH ~ 9, LU = 8 (40° C./80 RH/1D) | Black | — | — | 10/— | 90% Clean | — |

Notes:
LU: Exposure light unit;
RH: Relative Humidity;
D: Days;
Hi: % Highlight dot;
Sh; % Shadow dot;
Hi$\mu$: Highlight microline;
Sh$\mu$: Shadow microline;
—: Data Not Collected.

TABLE 1-B-3

Resolution of Example 3 (7.5% SPP) Under Different Storage Conditions, pH's, and Exposures

| Plate, pH, LU | Observation at Start of Run | | | Observations After 100 Images | | |
|---|---|---|---|---|---|---|
| (Storage Condition) | Steps | Hi/Sh | Hi$\mu$/Sh$\mu$ | Steps | Hi/Sh | Hi$\mu$/Sh$\mu$ |
| Example 3, pH ~ 6.5, LU = 8 (40° C./80 RH/2D) | 9/15 | Slight Blinding | Slight Blinding | 8/12 | 2/80 | 6/30 |

Notes:
LU: Exposure light unit;
RH: Relative Humidity;
D: Days;
Hi: % Highlight dot;
Sh; % Shadow dot;
Hi$\mu$: Highlight microline;
Sh$\mu$: Shadow microline;
—: Data Not Collected.

TABLE 1-B-4

Resolution of Example 4 (10% SPP) Under Different Storage Conditions

| Plate, pH, LU | Observation at Start of Run | | | Observations After 100 Images | | |
|---|---|---|---|---|---|---|
| (Storage Condition) | Steps | Hi/Sh | Hi$\mu$/Sh$\mu$ | Steps | Hi/Sh | Hi$\mu$/Sh$\mu$ |
| Example 4, pH ~ 6.5, LU = 8 (60° C./2D) | 12/— | 2/40 | 10/55 | 8/14 | 2/80 | 6/30 |
| Example 4, pH ~ 6.5, LU = 8 (40° C./80 RH/1D) | 10/— | 90% Clean | — | 8/13 | 2/70 | 6/30 |

Notes:
LU: Exposure light unit;
RH: Relative Humidity;
D: Days;
Hi: % Highlight dot;
Sh; % Shadow dot;
Hi$\mu$: Highlight microline;
Sh$\mu$: Shadow microline;
—: Data Not Collected.

As evident from the Tables above, each of Examples 1 to 4—each utilizing a polyphosphate-containing overcoat—demonstrated overall an enhanced resistance to the adverse influence of prolonged storage under hot and humid conditions. In contrast, after storage in the same conditions, the Ctrl-A plate—which did not incorporate polyphosphate in its overcoat—could not be developed on-press. Little correlation was also observed between printing performance and pH variations in the overcoat formulation, thus suggesting that the polyphosphate addition can facilitate manufacture and coating processes by reducing the need to carefully monitor and regulate pH.

Examples 5 to 6

Overcoated printing plate precursor elements (i.e., Examples 5 to 6) were made in accordance with the Preparation above, wherein the overcoat formulations were prepared using the recipe set forth in the following Table 5-A.

TABLE 5-A

Preparation of Overcoat Formulations
(Quantities Reported in % Weight Film Solids)

| Component | Control-B 0% SPP | Ex. 5 5% SPP | Ex. 6 7.5% SPP |
|---|---|---|---|
| Polyvinyl Alcohol (PVA 603, from Air Products). | 81.27 | 81.27 | 81.27 |
| EMA-ASA-TEMPO (A sodium salt of 2-aminoethyl sulfonate and 4-amino TEMPO substituted poly(ethylene-maleic anhydride). See U.S. Pat. No. 5,599,650. | 8.96 | 8.96 | 8.96 |
| Sodium Gluconate. | 4.58 | 2.24 | 1.06 |
| Pluronic L43 Surfactant (A nonionic surfactant from BASF comprising block copolymers of propylene oxide and ethylene oxide, HLB 12.0). | 3.6 | 1.7 | 0.8 |
| Triton X-100 (a alkylphenol-ethylene oxide adduct). | 1.02 | 0.5 | 0.24 |
| Aerosol-OT (a dialkylester of sodium sulfosuccinic acid, from Fischer). | 0.6 | 0.3 | 0.1 |
| SPP (Sodium Polyphosphate). | 0 | 5 | 7.5 |

As apparent, the overcoat formulations of Examples 5 and 6 are for the most part similar but for the concentration of the polyphosphate component. The overcoat of Ctrl-B ("Control") was formulated without polyphosphate. The plates were cut in half and stored for 2 or 3 days, half at room temperature, the other half under hot and/or humid conditions. The plates were then exposed, mounted onto a printing press, and run. Observations are provided in the following Table 5-B.

TABLE 5-B

Comparative Resolution of Control-B, and Examples 5 and 6,
Under Different Storage Conditions (Exposure = 8 LU)

| Plate, (Storage Condition) | Observation at Start of Run | | | | | Observations After 100 Images | | | | |
|---|---|---|---|---|---|---|---|---|---|---|
| | Steps | Hi | Sh | Hi$\mu$ | Sh$\mu$ | Steps | Hi | Sh | Hi$\mu$ | Sh$\mu$ |
| Control, (60° C./3D) | 11/16 | 3 | 60 | 6 | 40 | 8/15 | 3 | 80 | 6 | 40 |
| Control, (40° C./80 RH/3D) | Dark | — | — | — | — | Tone | — | — | — | — |
| Example 5, (60° C./2D) | 6/13 | 3 | 70 | 6 | 40 | 4/13 | 5 | 80 | 8 | 30 |
| Example 5, (40° C./80 RH/2D) | 9/— | 80% Clean | 80% Clean | — | — | 7/14 | 2 | 80 | 8 | 40 |
| Example 6, (60° C./3D) | 10/16 | 2 | 60 | 6 | 40 | 8/15 | 2 | 70 | 6 | 40 |
| Example 6, (40° C./80 RH/3D) | 7/14 | 3 | 70 | 8 | 40 | 7/14 | 2 | 70 | 6 | 40 |
| Example 6, (40° C./80 RH/2D) | 10/16 | 2 | 60 | 8 | 55 | 8/14 | 2 | 70 | 6 | 30 |

Notes:
LU: Exposure light unit;
RH: Relative Humidity;
D: Days;
Hi: % Highlight dot;
Sh; % Shadow dot;
Hi$\mu$: Highlight microline;
Sh$\mu$: Shadow microline;
—: Data Not Collected.

As evident from the Table above, each of Examples 5 to 6—each utilizing a polyphosphate-containing overcoat—demonstrated overall an enhanced resistance to the adverse influence of prolonged storage under hot and humid conditions. In contrast, after storage in the same hot and humid conditions, the Ctrl-B plate—which did not incorporate polyphosphate in its overcoat—could not be developed on-press.

Example 7

Overcoated printing plate precursor elements (i.e., Example 7) were made in accordance with the Preparation above, and wherein the overcoat formulations were prepared using the recipe set forth in the following Table 7-A.

TABLE 7-A

Preparation of Overcoat Formulations
(Quantities Reported in % Weight Film Solids)

| Component | Ex. 7 (9.5% SPP) |
|---|---|
| Polyvinyl Alcohol (PVA 603, from Air Products). | 76.2 |
| EMA-ASA-TEMPO (A sodium salt of 2-aminoethyl sulfonate and 4-amino TEMPO substituted poly(ethylene-maleic anhydride). See U.S. Pat. No. 5,599,650. | 8.4 |
| Sodium Gluconate. | 4.29 |
| Triton X-100 (a alkylphenol-ethylene oxide adduct). | 1.02 |
| Aerosol-OT (a dialkylester of sodium sulfosuccinic acid, from Fischer). | 0.61 |
| STPP (Sodium Tripolyphosphate). | 9.5 |

Certain plates were stored for a day at room temperature, others at 40° C. and 80% relative humidity. The plates were then imagewise exposed, and ran immediately in a printing press. Plates stored at room temperature produced clean images at the start and after 100 impressions. Although initial impressions were somewhat "dirty", clean images were ultimately printed from the 40° C./80RH-stored plates after only about 100 impressions.

We claim:

1. A printing plate precursor element comprising: (a) a substrate having either an affinity or aversion to printing ink; (b) a photosensitive layer deposited over said substrate having either an affinity or aversion to said printing ink substantially opposite said affinity or aversion of said substrate, said photosensitive layer including at least a photopolymerizable, photocrosslinkable, or photorearrangeable compound and whereby said photosensitive layer is capable of being imagewise photohardened, photosolubilized, or photodifferentiated upon imagewise exposure to actinic radiation; and (c) overcoat containing a polyphosphate salt deposited over said photosensitive layer, said overcoat being essentially photoinsensitive, said polyphosphate salt having been made by water-depletion of an orthophosphate.

2. The printing plate precursor element of claim 1, wherein said polyphosphate is a sodium polyphosphate.

3. The printing plate precursor element of claim 2, wherein said sodium polyphosphate is sodium tripolyphosphate.

4. The printing plate precursor element of claim 1, wherein said substrate is hydrophilic and oleophobic, and said photosensitive layer is oleophilic.

5. The printing plate precursor element of claim 4, wherein said substrate is an anodized, grained aluminum substrate.

6. The printing plate precursor element of claim 5, wherein said photosensitive layer is deposited onto said substrate at a coverage of 70 to 150 mg/ft$^2$.

* * * * *